United States Patent
Wei et al.

(10) Patent No.: US 9,112,469 B2
(45) Date of Patent: Aug. 18, 2015

(54) VOLUME CONTROL DEVICE AND METHOD THEREOF

(71) Applicants: Inventec (Pudong) Technology Corporation, Shanghai (CN); INVENTEC CORPORATION, Taipei (TW)

(72) Inventors: Chia-Chyun Wei, Taipei (TW); Yi-Ming Pan, Taipei (TW); Ming-Jen Chang, Taipei (TW); Yi-Tang Liu, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 275 days.

(21) Appl. No.: 13/802,894

(22) Filed: Mar. 14, 2013

(65) Prior Publication Data

US 2014/0093092 A1 Apr. 3, 2014

(30) Foreign Application Priority Data

Sep. 29, 2012 (CN) .......................... 2012 1 0374877

(51) Int. Cl.
*H03G 3/20* (2006.01)
*H03G 3/04* (2006.01)
*H03G 3/30* (2006.01)

(52) U.S. Cl.
CPC . *H03G 3/20* (2013.01); *H03G 3/04* (2013.01); *H03G 3/3026* (2013.01)

(58) Field of Classification Search
CPC ......... H03G 3/20; H03G 3/3036; H03G 3/02; H03G 3/04; H03G 1/00; H03G 1/0088; H04R 5/033; H04R 5/04; H04R 1/1041; H04R 3/00; H04R 2430/01; H01H 19/00; H01H 19/005; H01H 2019/006; H01H 19/14; G10H 1/46
USPC .................. 381/104, 107, 109, 74; 323/318; 345/184
See application file for complete search history.

(56) References Cited

U.S. PATENT DOCUMENTS

| | | | | |
|---|---|---|---|---|
| 4,239,938 | A | * | 12/1980 | Ponto ............................ 381/104 |
| 4,349,779 | A | * | 9/1982 | Ono .............................. 323/318 |
| 5,513,268 | A | * | 4/1996 | Bironas et al. ................ 381/109 |

(Continued)

FOREIGN PATENT DOCUMENTS

TW    I352310 B    11/2011

*Primary Examiner* — Vivian Chin
*Assistant Examiner* — Jason R Kurr
(74) *Attorney, Agent, or Firm* — Locke Lord LLP; Tim Tingkang Xia, Esq.

(57) ABSTRACT

A volume control device and a method thereof are provided. The volume control device adapted to a mobile electronic device comprises a signal generating unit generating a plus pulse signal and a minus pulse signal according to user's rotation operation, a detection unit detecting a connecting state between the volume control device and an earphone to generate a detection signal, and a control unit selecting one of a first volume modulation mode and a second volume modulation mode according to the detection signal. Under the first volume modulation mode, the control unit generates a first control signal according to the plus pulse signal or the minus pulse signal. Under the second volume modulation mode, the control unit generates a second control signal according to the plus pulse signal or the minus pulse signal. The mobile electronic device controls volume according to the first or second control signal.

5 Claims, 2 Drawing Sheets

(56) References Cited

U.S. PATENT DOCUMENTS

| | | |
|---|---|---|
| 6,696,984 B2 * | 2/2004 | Choi .................................. 341/6 |
| 7,519,185 B2 * | 4/2009 | Liang ................................ 381/74 |
| 8,036,400 B2 * | 10/2011 | Sunaga et al. .................. 381/109 |
| 8,831,241 B2 * | 9/2014 | Ma et al. .......................... 381/74 |
| 2002/0031236 A1 * | 3/2002 | Shimizu et al. ................ 381/104 |
| 2007/0142942 A1 * | 6/2007 | Hyatt .............................. 700/94 |

* cited by examiner

VOLUME CONTROL DEVICE AND METHOD THEREOF

CROSS-REFERENCE TO RELATED APPLICATIONS

This non-provisional application claims priority under 35 U.S.C. §119(a) on Patent Application No(s). 201210374877.8 filed in China on Sep. 29, 2012, the entire contents of which are hereby incorporated by reference.

BACKGROUND

1. Technical Field

The disclosure relates to a volume control technique, and more particularly to a volume control device and a method thereof.

2. Related Art

With the digital epoch coming, consumers pay more and more attention on the audio and video function of a notebook. Most of the present notebooks control volume by using a software manner, which is not convenient to a user.

Thus, some notebooks utilize variable resistors to control volume. However, such an analog volume control manner has no relation with the software manner. As a result, a user has to control the variable resistor and the software interface simultaneously to set volume at a maximum level.

Moreover, the variable resistor has the rotation time limit or the rotation range limit. Thus, it is not convenient for user to use the variable resistor which may easily have a breakdown caused by error contact in long term usage.

SUMMARY

In view of the above problems, the disclosure provides a volume control device and a method thereof. Thereby, a fast volume modulation can be achieved, and the volume modulation mode and the volume modulation range can be changed according to whether an earphone is electronically connected thereto, such that the usage convenience is enhanced.

The disclosure relates to a volume control device, which is adapted to a mobile electronic device and comprises a signal generating unit, a detection unit and a control unit. The signal generating unit generates a plus pulse signal and a minus pulse signal according to the turning operation of a user. The detection unit detects whether the volume control device electronically connects with an earphone, so as to generate a detection signal. The control unit electronically connects with the signal generating unit and the detection unit, and selects one of a first volume modulation mode and a second volume modulation mode according to the detection signal. Under the first volume modulation mode, the control unit generates a first control signal according to a plus pulse signal or a minus pulse signal. Under the second volume modulation mode, the control unit generates a second control signal according to the plus pulse signal or the minus pulse signal. Thus, the mobile electronic device controls volume according to the first control signal or the second control signal.

In one embodiment of the disclosure, the signal generating unit includes a knob, a first switch, a second switch, a first resistor, a second resistor and an inverter. The knob is turned by the user. The first switch electronically connects with the control unit and a ground, and generates the plus pulse signal when the knob is turned clockwise. The second switch electronically connects with the control unit and the ground, and generates a pulse signal when the knob is turned anti-clockwise. The first end of the first resistor receives an operation voltage. The second end of the first resistor electronically connects with the first switch. The first end of the second resistor receives the operation voltage. The second end of the second resistor electronically connects with the second switch. The inverter electronically connects with and is between the control unit and the second switch. Thus, the pulse signal is inverted to generate the minus pulse signal.

In one embodiment of the disclosure, the detection unit includes a connection port, a third resistor, a transistor and a fourth resistor. The connection port electronically connects with the earphone. The first end of the third resistor electronically connects with the connection port. The gate end of the transistor electronically connects with the second end of the third resistor. The source end of the transistor electronically connects with the ground. The drain end of the transistor generates the detection signal. The first end of the fourth resistor receives the operation voltage. The second end of the fourth resistor electronically connects with the drain end of the transistor.

In one embodiment of the disclosure, the first volume modulation mode indicates that the volume control device does not electronically connect with the earphone. The second volume modulation mode indicates that the volume control device electronically connects with the earphone. The volume modulation range of the first volume modulation mode is greater than that of the second volume modulation mode.

In one embodiment of the disclosure, the control unit further calculates a pulse number of the plus pulse signal and a duration time of the plus pulse signal, or calculates a pulse number of the minus pulse signal and a duration time of the minus pulse signal. Under the first volume modulation mode, the control unit generates a first control signal in a lookup table manner according to the pulse number and duration time of the plus pulse signal or according to the pulse number and duration time of the minus pulse signal. Under the second volume modulation mode, the control unit generates a second control signal in the lookup table manner according to the pulse number and duration time of the plus pulse signal or according to the pulse number and duration time of the minus pulse signal.

In one embodiment of the disclosure, the control unit includes a timer, a counter and a processor. The timer electronically connects with the signal generating unit and selectively clocks one of the plus pulse signal and the minus pulse signal to output the duration time of the plus pulse signal or of the minus pulse signal. The counter electronically connects with the signal generating unit and selectively counts one of the plus pulse signal and the minus pulse signal to output the pulse number of the plus pulse signal or of the minus pulse signal. The processor electronically connects with the timer, the counter and the detection unit. The processor receives the pulse number and duration time of the plus pulse signal or of the minus pulse signal. Under the first volume modulation mode, the processor generates the first control signal in the lookup table manner according to the pulse number and duration time of the plus pulse signal or of the minus pulse signal. Under the second volume modulation mode, the processor generates the second control signal in the lookup table manner according to the pulse number and duration time of the plus pulse signal or of the minus pulse signal.

The disclosure provides a volume control method, which includes the following steps. One of a plus pulse signal and a minus pulse signal is received. The plus pulse signal and the minus pulse signal are generated by the turning operation of a user. An earphone is detected whether to electronically connect with the volume control device, so as to generate a detection signal. According to the detection signal, one of a first volume modulation mode and a second volume modulation mode is selected. Under the first volume modulation mode, a first control signal is generated according to one of the plus pulse signal and the minus pulse signal. Under the second volume modulation mode, a second control signal is generated according to one of the plus pulse signal and the minus pulse signal. Volume is controlled according to one of the first control signal and the second control signal.

In one embodiment of the disclosure, the first volume modulation mode indicates that the volume control device does not electronically connect with the earphone, and the second volume modulation mode indicates that the volume control device electronically connects with the earphone. The volume modulation range of the first volume modulation mode is greater than that of the second volume modulation mode.

In one embodiment of the disclosure, the step of generating the first control signal or the second control signal includes the calculation of the pulse number and duration time of the plus pulse signal or of the minus pulse signal. Moreover, under the first volume modulation mode, the first control signal is generated in the lookup table manner according to the pulse number and duration time of plus pulse signal or of the minus pulse signal. Under the second volume modulation mode, the second control signal is generated in lookup table manner according to the pulse number and duration time of the plus pulse signal or of the minus pulse signal.

The disclosure relates to a volume control device and a method thereof. Through user's turning operation, the disclosure generates the plus pulse signal and minus pulse signal. Through the pulse number and duration time of the plus pulse signal, or through the pulse number and duration time of the minus pulse signal, the disclosure controls volume and detects whether any earphone electronically connects with the mobile electronic device, thereby changing the volume modulation mode and the volume modulation interval. Therefore, the disclosure increases the speed of volume control, and avoids volume up or down suddenly when the disclosure utilizes the same volume modulation interval.

For purposes of summarizing, some aspects, advantages and features of some embodiments of the disclosure have been described in this summary. Not necessarily all of (or any of) these summarized aspects, advantages or features will be embodied in any particular embodiment of the disclosure. Some of these summarized aspects, advantages and features and other aspects, advantages and features may become more fully apparent from the following detailed description and the appended claims.

BRIEF DESCRIPTION OF THE DRAWINGS

The disclosure will become more fully understood from the detailed description given herein below for illustration only, and thus are not limitative to the disclosure, and wherein.

DETAILED DESCRIPTION

The detailed features and advantages of the disclosure are described below in great detail through the following embodiments, the content of which is sufficient for those skilled in the art to understand the technical content of the disclosure and to implement the disclosure accordingly. Based on the content of the specification, the claims, and the drawings, those skilled in the art can easily understand the relevant objectives and advantages of the disclosure.

Figure 1:
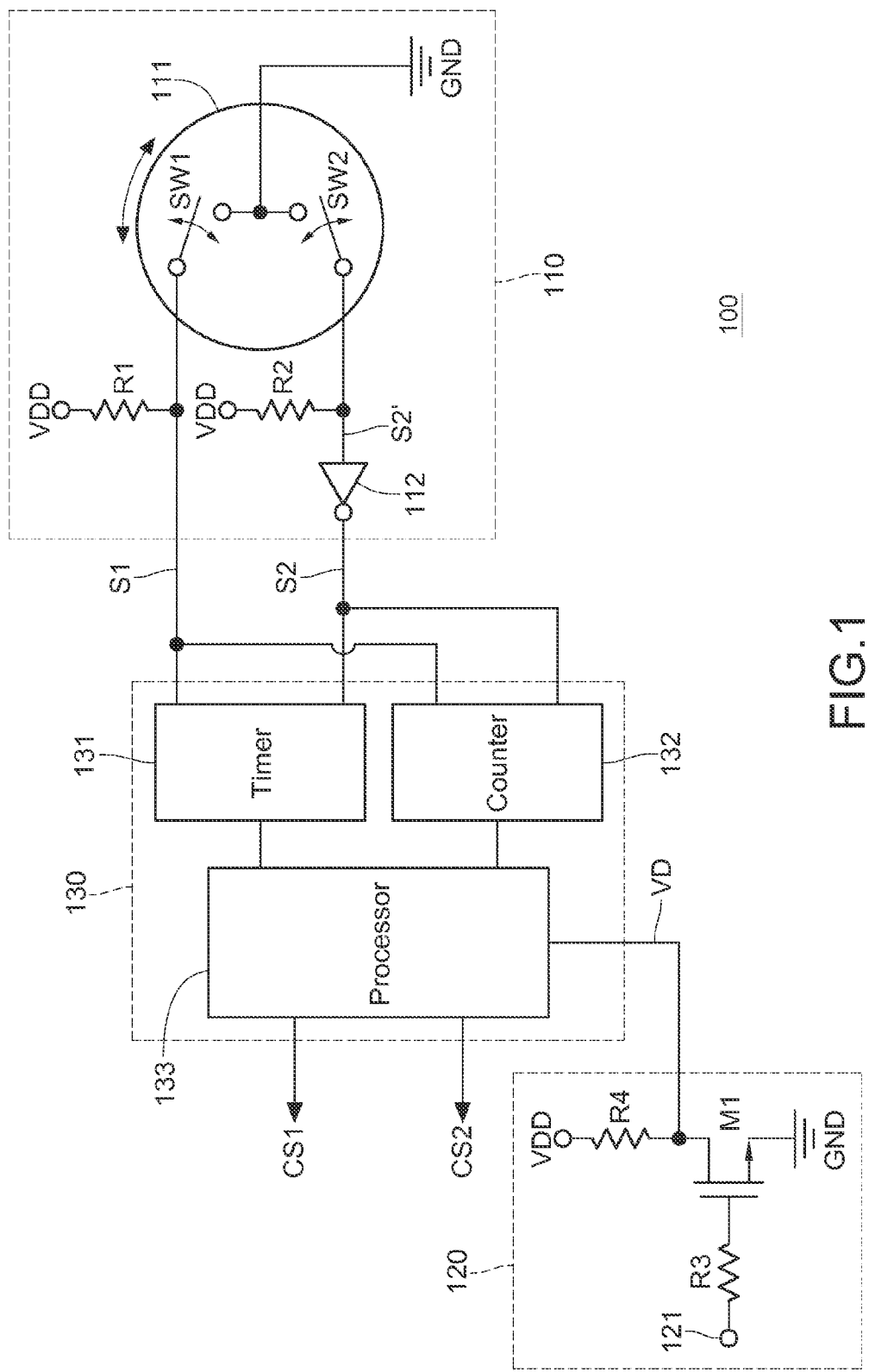
FIG. 1 is a circuit diagram of a volume control device of the disclosure.

FIG. 1 illustrates a circuit diagram of a volume control device of the disclosure. The volume control device 100 is implemented in a mobile electronic device to control volume. For example, the mobile electronic device may be, but not limit to, a notebook, a tablet computer and so on. The volume control device 100 includes a signal generating unit 110, a detection unit 120 and a control unit 130. The signal generating unit 110 is turned by a user so as to generate a plus pulse signal S1 and a minus pulse signal S2. The plus pulse signal S1 is the basis of increase volume, and the minus pulse signal S2 is the basis of reduce volume.

The signal generating unit 110 includes a knob 111, a first switch SW1, a second switch SW2, a first resistor R1, a second resistor R2 and an inverter 112. The knob 111 is turned by the user in a turning operation manner, such as the clockwise turning or the anti-clockwise turning. The first switch SW1 electronically connects with and is between the control unit 130 and a ground GND, and generates the plus pulse signal S1 when the knob 111 is turned clockwise. The second switch SW2 electronically connects with and is between the control unit 130 and the ground GND, and generates a pulse signal S2' when the knob 111 is turned anti-clockwise. The first end of the first resistor R1 receives an operation voltage VDD. The second end of the first resistor R1 electronically connects with the first switch SW1. The first end of the second resistor R2 receives the operation voltage VDD. The second end of the second resistor R2 electronically connects with the second switch SW2. The inverter 112 electronically connects with and is between the control unit 130 and the second switch SW1. The inverter 112 inverts the pulse signal S2' to generate the minus pulse signal S2.

In one state in this embodiment, when the knob 111 is turned clockwise, the knob 111 controls the operation of the first switch SW1. This causes the first switch SW1 turned on and then turned off, so as to generate the plus pulse signal S1. For example, when the knob 111 is turned and then controls the first switch SW1 to switch once, the first switch SW1 is turned on and off once. Thus, a pulse occurs in the plus pulse signal S1. When the knob 111 is turned and then controls the first switch SW2 to switch twice, the first switch SW1 is turned on and off twice. Thus, two pulses occur in the plus pulse signal S1. In this way, more pulses may occur in the plus pulse signal S1.

In another state in this embodiment, when the knob 111 is turned anti-clockwise, the knob 111 controls the second switch SW2 to switch. This causes the second switch SW2 turned on and then turned off, so as to generate the pulse signal S2'. For example, when the knob 111 is turned and then controls the second switch SW1 to switch once, the second switch SW2 is turned on and off once. Thus, a pulse occurs in the pulse signal S2'. When the knob 111 is turned and then controls the second switch SW2 to switch twice, the second switch SW2 is turned on and off twice. Thus, two pulses occur in the pulse signal S2'. In this way, more pulses may occur in the plus pulse signal S2'. Various pulse numbers of the plus pulse signal S1 and of the minus pulse signal S2 may be generated when the knob 111 is turned in various ways.

The detection unit 120 detects whether the volume control device 100 electronically connects with an earphone, that is, detects whether the earphone is plugged in the mobile electronic device, so as to generate a detection signal VD. For example, when the detection unit 120 discovers that the volume control device 100 does not electronically connect with the earphone, the detection unit 120 generates the detection signal VD of high logic level. In contrast, when the detection unit 120 discovers that the volume control device 100 electronically connects with the earphone, the detection unit 120 generates the detection signal VD of low logic level.

Furthermore, the detection unit 120 includes a connection port 121, a third resistor R3, a transistor M1 and a fourth resistor R4. The connection port 121 is adapted to electronically connect with the earphone. The first end of the third resistor R3 electronically connects with the connection port 121. The gate end of the transistor M1 electronically connects with the second end of the third resistor R3. The source end of the transistor M1 electronically connects with the ground GND. The drain end of the transistor M1 generates the detection signal VD. The first end of the fourth resistor R4 receives the operation voltage VDD. The second end of the fourth resistor R4 electronically connects with the drain end of the transistor M1.

When the connection port 121 does not electronically connect with the earphone, the gate end of the transistor M1 receives a signal of low logic level through the third resistor R3. Herein, the transistor M1 is turned off, and the detection signal VD becomes high logic level. When the connection port 121 electronically connects with the earphone, the gate end of the transistor M1 receives a signal of high logic level through the third resistor R3. Herein, the transistor M1 is turned on, the second end of the fourth resistor R4 electronically connects with the ground GND through the transistor M1, and the detection signal VD becomes low logic level.

The control unit 130 electronically connects with the signal generating unit 110 and the detection unit 120. The control unit 130 receives the plus pulse signal S1, the minus pulse signal S2 and the detection signal VD. The control unit 130 selects one of the first volume modulation mode and the second volume modulation mode according to the detection signal VD. Under the first volume modulation mode, the control unit 130 generates the first control signal CS1 according to the plus pulse signal S1 or the minus pulse signal S2. Under the second volume modulation mode, the control unit 130 generates the second control signal CS2 according to the plus pulse signal S1 or the minus pulse signal S2. The volume control device 100 controls volume according to the first control signal CS1 or the second control signal CS2.

In this embodiment, the first volume modulation mode indicates that the volume control device 100 dose not electronically connect with the earphone, and the second volume modulation mode indicates that the volume control device 100 electronically connects with the earphone. In other word, when the control unit 130 receives the detection signal VD of high logic level, the control unit 130 switches to the first volume modulation mode to control volume. When the control unit 130 receives the detection signal VD of low logic level, the control unit 130 switches to the second volume modulation mode to control volume. Moreover, the control unit 130 calculates a pulse number of the plus pulse signal S1 and a duration time of the plus pulse signal S1, and calculates a pulse number of the minus pulse signal S2 and the duration time of the minus pulse signal S2.

Under the first volume modulation mode, the control unit 130 generates the first control signal CS1 in the lookup table manner according to the pulse number of the plus pulse signal S1 and the duration time of the plus pulse signal S1, or according to the pulse number of the minus pulse signal S2 and the duration time of the minus pulse signal S2. Under the second volume modulation mode, the control unit 130 generates the second control signal CS2 in the lookup table manner according to the pulse number of the plus pulse signal S1 and the duration time of the plus pulse signal S1, or according to the pulse number of the minus pulse signal S2 and the duration time of the minus pulse signal S2.

The control unit 130 includes a timer 131, a counter 132 and a processor 133. The timer 131 electronically connects with the signal generating unit 110, and selectively clocks one of the plus pulse signal S1 and the minus pulse signal S2 to output the duration time of the plus pulse signal S1 or of the minus pulse signal S2. The counter 132 electronically connects with the signal generating unit 110, and selectively counts one of the plus pulse signal S1 and the minus pulse signal S2 to output the pulse number of the plus pulse signal S1 or of the minus pulse signal S2.

The processor 133 electronically connects with the timer 131, the counter 132 and the detection unit 120 and receives the detection signal VD. The processor 133 receives the pulse number and duration time of the plus pulse signal S1 or the pulse number and duration time of the minus pulse signal S2. Under the first volume modulation mode, the processor 133 generates the first control signal CS1 in the lookup table manner according to the pulse number and duration time of the plus pulse signal S1 or the minus pulse signal S2. Under the second volume modulation mode, the processor 133 generates the second control signal CS2 in the lookup table manner according to the pulse number and duration time of the plus pulse signal S1 or the minus pulse signal S2.

The volume modulation range of first volume modulation mode is greater than that of the second volume modulation mode. The volume control device 100 can control volume according to various speeds which the knob 111 is turned at.

In one state, under the first volume modulation mode, the volume control device 100 controls volume. When the pulse number of the plus pulse signal S1 is, for example, more than twenty and when the duration time of the plus pulse signal S1 is T, the rotation speed of the knob 111 is fast. This causes that the processor 133 generates the first control signal CS1 having a greater volume modulation range, for example, ten percent. When the pulse number of the plus pulse signal S1 is, for example, between ten to twenty and when the duration time of the plus pulse signal S1 is T, the rotation speed of the knob 111 is middle. This causes that the processor 133 generates the first control signal CS1 having a middle volume modulation range, for example, from two percent to nine percent. When the pulse number of the plus pulse signal S1 is, for example, less than ten and when the duration time of the plus pulse signal S1 is T, the rotation speed of the knob 111 is slow. This causes that the processor 133 generates the first control signal CS1 having a minimum volume modulation range, for example, one percent. Similarly, the pulse number and duration time of the minus pulse signal S2 are generated in this way.

In another state, under the second volume modulation mode, the volume control device 100 controls volume. When the pulse number of the plus pulse signal S1 is, for example, more than twenty and when the duration time of the plus pulse signal S1 is T, the rotation speed of the knob 111 is fast. This causes that the processor 133 generates the second control signal CS2 having a greater volume modulation range, for example, five percent. When the pulse number of the plus pulse signal S1 is, for example, between ten and twenty and when the duration time of the plus pulse signal S1 is T, the rotation speed of the knob 111 is middle. This causes that the processor 133 generates the second control signal CS2 having a middle volume modulation range, for example, from two percent to four percent. When the pulse number of the plus pulse signal S1 is, for example, less than ten and when the duration time of the plus pulse signal S1 is T, the rotation speed of the knob 111 is slow. This causes that the processor 133 generates the second control signal CS2 having a minimum volume modulation range, for example, one percent. Similarly, the pulse number and duration time of the minus pulse signal S2 are generated in this way.

As set forth above, the volume control device 100 is capable of increasing the speed of controlling volume when an earphone is not plugged in the mobile electronic device, and is also capable of changing the interval of volume modulation when an earphone is plugged in the mobile electronic device. Thus, the disclosure may avoid volume up or down suddenly when the disclosure utilizes the same volume modulation interval, that is, the interval that a loudspeaker uses to control volume. The detail of the volume control method utilized by the volume control device 100 is described as follows.

Figure 2:
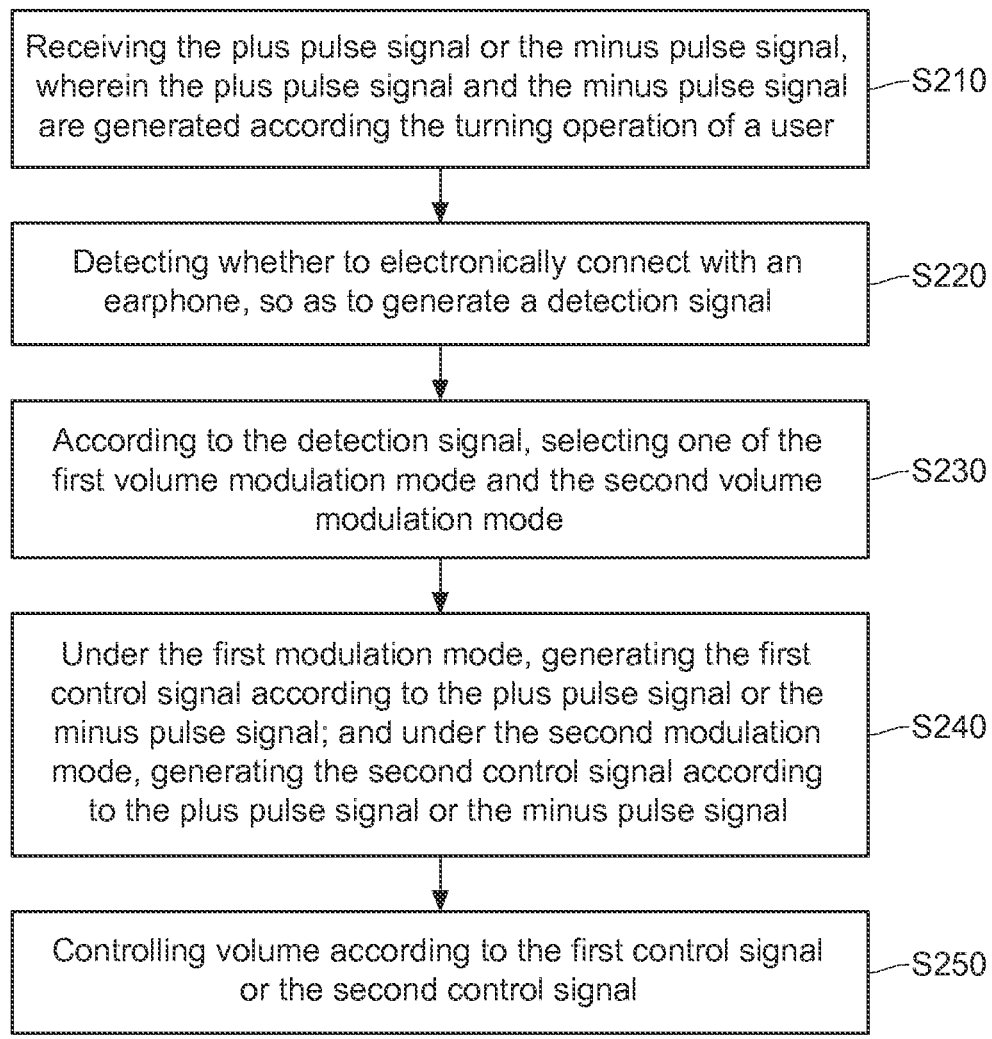
FIG. 2 is a flow chart of a volume control method of the disclosure.

FIG. 2 illustrates a flow chart of a volume control method of the disclosure. A plus pulse signal or a minus pulse signal is received in the step S210. The plus pulse signal and the minus pulse signal are generated according to user's turning operation. The disclosure is detected whether to electronically connects with any earphone as shown in the step S220, so as to generate a detection signal. According to the detection signal, one of a first volume modulation mode and a second volume modulation mode is selected as shown in the step S230. As shown in the step S240, a first control signal is generated under the first volume modulation mode according to one of a plus pulse signal and a minus pulse signal, and a second control signal is generated under the second volume modulation mode according to one of the plus pulse signal and the minus pulse signal. The first control signal or the second control signal is utilized to control volume in the step S250.

Specifically, in the step S240, the pulse number and the duration time of the plus pulse signal are calculated, or the pulse number and duration time of the minus pulse signal are calculated. Subsequently, under the first volume modulation mode, a first control signal is generated in a lookup table manner according to the pulse number and duration time of the plus pulse signal or according to the pulse number and duration time of the minus pulse signal, and under the second volume modulation mode, a second control signal is generated in the lookup table manner according to the pulse number and duration time of the plus pulse signal or according to the pulse number and duration time of the minus pulse signal.

In the disclosure, the first volume modulation mode indicates that the volume control device does not electronically connect with any earphone, and the second volume modulation mode indicates that the volume control device electronically connects with an earphone. The volume modulation range of the first volume modulation mode is greater than that of the second volume modulation mode.

Through user's turning operation, the disclosure generates the plus pulse signal and minus pulse signal. Through the pulse number and duration time of the plus pulse signal, or through the pulse number and duration time of the minus pulse signal, the disclosure controls volume and detects whether any earphone electronically connects with the mobile electronic device, thereby changing the volume modulation mode and the volume modulation interval. Therefore, the disclosure increases the speed of volume control, and avoids volume up or down suddenly when the disclosure utilizes the same volume modulation interval.

The disclosure may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A volume control device, adapted to a mobile electronic device, comprising:
    a signal generating unit, configured to generate a plus pulse signal or a minus pulse signal according to a turning operation of a user, comprising:
        a knob, configured to be turned by the user;
        a first switch, electronically connecting with and disposed between a control unit and a ground, and configured to generate the plus pulse signal when the knob is turned clockwise;
        a second switch, electronically connecting with and disposed between the control unit and the ground, and configured to generate a pulse signal when the knob is turned anti-clockwise;
        a first resistor, a first end thereof receiving an operation voltage, and a second end thereof electronically connecting to the first switch;
        a second resistor, a first end thereof receiving the operation voltage, and a second end thereof electronically connecting with the second switch; and
        an inverter, electronically connecting with and disposed between the control unit and the second switch, and configured to invert the pulse signal to generate the minus pulse signal;
    a detection unit, configured to detect whether the volume control device electronically connects with an earphone, so as to generate a detection signal; and
    the control unit, electronically connecting with the signal generating unit and the detection unit, configured to select one of a first volume modulation mode and a second volume modulation mode according to the detection signal, and generate a first control signal according to the first volume modulation mode with the plus pulse signal or the first volume modulation mode with the minus pulse signal, or generate a second control signal according to the second volume modulation mode with the plus pulse signal or the second volume modulation mode with the minus pulse signal;
    wherein the mobile electronic device controls volume according to one of the first control signal and the second control signal.

2. The volume control device according to claim 1, wherein the detection unit comprises:
    a connection port, configured to electronically connect with the earphone;
    a third resistor, a first end thereof electronically connecting with the connection port;
    a transistor, the gate end thereof electronically connecting with a second end of the third resistor, the source end thereof electronically connecting with a ground, and the drain end thereof generating the detection signal; and
    a fourth resistor, a first end thereof receiving an operation voltage, and a second end thereof electronically connecting with the drain end of the transistor.

3. The volume control device according to claim 1, wherein the first volume modulation mode indicates that the volume control device does not electronically connect with the earphone, the second volume modulation mode indicates that the volume control device electronically connects with the earphone, and a volume modulation range of the first volume modulation mode is greater than that of the second volume modulation mode.

4. The volume control device according to claim 3, wherein the control unit calculates a pulse number of the plus pulse signal and a duration time of the plus pulse signal or calculates a pulse number of the minus pulse signal and a duration time of the minus pulse signal, the control unit under the first volume modulation mode generates the first control signal in a lookup table manner according to the pulse number and duration time of the plus pulse signal or of the minus pulse signal, and the control unit under the second volume modulation mode generates the second control signal in the lookup table manner according to the pulse number and duration time of the plus pulse signal or of the minus pulse signal.

5. The volume control device according to claim 1, wherein the control unit comprises:
   a timer, electronically connecting with the signal generating unit, and configured to clock the plus pulse signal or the minus pulse signal and then to output duration time of the plus pulse signal or duration time of the minus pulse signal;
   a counter, electronically connecting with the signal generating unit, and configured to count the plus pulse signal or the minus pulse signal and then to output a pulse number of the plus pulse signal or a pulse number of the minus pulse signal; and
   a processor, electronically connecting with the timer, the counter and the detection unit, and configured to receive the detection signal and to receive the pulse number and duration time of the plus pulse signal or the pulse number and duration time of the minus pulse signal, the processor under the first volume modulation mode generating the first control signal in a lookup table manner according to the pulse number and duration time of the plus pulse signal or of the minus pulse signal, the processor under the second volume modulation mode generating the second control signal in the lookup table manner according to the pulse number and duration time of the plus pulse signal or of the minus pulse signal.

\* \* \* \* \*